United States Patent [19]

Semenik et al.

[11] Patent Number: 5,233,506
[45] Date of Patent: Aug. 3, 1993

[54] FASTENER FOR HOUSING ASSEMBLY

[75] Inventors: Scott R. Semenik, Lake Zurich; Mark W. Schwartz, Addison, both of Ill.

[73] Assignee: Motorola, Inc., Schaumburg, Ill.

[21] Appl. No.: 838,978

[22] Filed: Feb. 21, 1992

[51] Int. Cl.⁵ .............................................. H05K 7/00
[52] U.S. Cl. ...................................... 361/814; 292/81; 220/324; 361/600; 361/679; 361/728
[58] Field of Search ............... 220/424, 306, 307, 324, 220/326, 352, 353; 215/321; 292/80, 81, 87, 303; 361/331, 380, 392, 394, 395, 399, 422

[56] References Cited

U.S. PATENT DOCUMENTS

| | | | |
|---|---|---|---|
| 3,462,048 | 8/1969 | Henchert | 215/321 |
| 3,668,476 | 6/1972 | Wrabel et al. | 361/395 |
| 4,840,286 | 6/1989 | Heberling et al. | 220/307 |
| 4,979,616 | 12/1990 | Clanton | 220/4.24 |
| 5,139,165 | 8/1992 | Hara | 220/307 |

Primary Examiner—Gregory D. Thompson
Attorney, Agent, or Firm—Robert H. Kelly

[57] ABSTRACT

A fastener for fastening front and rear housing portions of a housing assembly theretogether. A resilient tongue member is affixed to a surface of the rear housing portion to extend upwardly therefrom. A beveled, top edge surface of the resilient tongue member defines a ramped, face surface which extends to a back-angled, force-receiving surface. A hook member positioned beneath the front housing portion is positioned to permit mated engagement with the tongue member. The hook member is permitted elastic deformation responsive to application of forces thereupon by the ramped, face surface of the resilient tongue member during translation of the hook and tongue members into a fastening position. Once positioned in a fastening position, the hook member returns to a nondeformed state, to fasten the tongue member in position thereat, thereby to fasten the front and rear housing portions theretogether.

15 Claims, 2 Drawing Sheets

FASTENER FOR HOUSING ASSEMBLY

BACKGROUND OF THE INVENTION

The present invention relates generally to fasteners for fastening two surfaces theretogether, and, more particularly, to a fastener for fastening a housing assembly theretogether.

Advancements in the field of radio electronics have permitted the introduction and commercialization of an ever-increasing array of radio communication apparatus. Advancements in electronic circuitry design have also permitted increased miniaturization of the electronic circuitry comprising such radio communication apparatus. As a result, an ever-increasing array of radio communication apparatus comprised of ever-smaller electronic circuitry has permitted the radio communication apparatus to be utilized more conveniently in an increased number of applications.

A radio transceiver, such as a radiotelephone utilized in a cellular, communication system, is one example of radio communication apparatus which has been miniaturized to be conveniently utilized in an increased number of applications. Additional efforts to miniaturize further the electronic circuitry of similar such radio transceivers, as well as other radio communication apparatus, are being made. Such further miniaturization of the radio transceivers will further increase the convenience of utilization of such apparatus, and will permit such apparatus to be utilized in further increased numbers of applications.

Pursuant to such efforts to miniaturize further the electronic circuitry of such radio transceivers (as well as other radio communication apparatus), size minimization of the electronic circuitry is a critical design goal during design of such circuitry.

Concomitant with the increased miniaturization of electronic circuitry is a corresponding reduction in the physical dimensions of the housings in which such electronic circuitry is housed as well as other mechanical structure associated therewith.

Initially, size reductions in the housings and associated mechanical structure was accomplished by simple, scale reduction of the dimensions of already-existing structures. However, beyond certain size reductions, such simple, scale reduction increasingly becomes impractical. Beyond a certain point, structural limitations of the materials comprising such structure cannot be reduced further without compromising the structural integrity thereof.

For instance, the housings of many such electronic devices are comprised of a thermoplastic material. The walls of such housings must be greater than minimal thicknesses to ensure the structural integrity of such walls, and the housings formed therefrom. Other housings and associated mechanical structures comprised of other materials suffer from similar, size-reduction limitations.

Many conventional, housing constructions are comprised of a front housing portion and a rear housing portion. In many instances, the electronic circuitry comprising the electronic device is disposed upon a circuit board (or several circuit boards) and the circuit board is mounted or otherwise affixed to the front housing portion of the conventional, housing construction. Once affixed in position, the rear housing portion is then placed beneath the circuit board and a fastener mechanism fastens the front and rear housing portions theretogether, thereby to enclose in supportive containment the circuit board within the housing construction. (The circuit board may, of course, alternately be first mounted to the rear housing portion, and then, once affixed, the housing portions may be affixed theretogether.)

The fastener mechanism by which the front and rear housing portions of the housing construction are fastened theretogether may be comprised of any of many various designs. Most simply, threaded shaft members may be utilized to affix the housing portions theretogether. Also, and particularly when the housing construction is formed of a thermoplastic material, the fastening mechanism may be formed integral with the abutting edge surfaces of the sidewalls of the respective housing portions.

Integrally-formed fastening mechanisms may be formed upon each of the housing portions in manners permitting fastening of the housing portions theretogether by merely positioning the housing portions against one another. Such fastening mechanisms permit housing constructions incorporating such to be self-fastening thereby.

However, due to the aforementioned size reduction in the housings of many electronic devices, existing fastening mechanisms for fastening portions of such housings theretogether cannot be utilized when the dimensions of housings are reduced beyond a certain level.

Additionally, many of such existing fastening mechanisms which are formed integral with the abutting edge surfaces of the sidewalls of the respective housing portions of such housing constructions are usually constructed to fasten permanently the housing portions theretogether. Once such fastening mechanisms fasten the housing portions theretogether, the housing portions may be separated only with significant difficulty, and, oftentimes, the housing portions are only separated by damaging the housing portions.

What is needed, therefore, is a fastener which may be utilized to fasten front and rear housing portions of a housing construction formed to be of reduced dimensions theretogether.

What is also needed is a fastener which releasably fastens housing portions of a housing assembly theretogether.

SUMMARY OF THE INVENTION

The present invention, accordingly, advantageously provides a fastener for fastening two surfaces theretogether.

The present invention yet further advantageously provides a fastener which releasably fastens two surfaces theretogether.

The present invention further advantageously provides a fastener for releasably fastening front and rear housing assembly portions theretogether.

The present invention provides further advantages and features, the details of which will become more evident by reading the detailed description of the preferred embodiment hereinbelow.

In accordance with the present invention, therefore, a fastener for fastening a first surface and a second surface positioned in tandem therewith is disclosed. The fastener comprises a resilient tongue member affixed to the first surface and positioned to extend upwardly therefrom. The tongue member has a beveled, top edge surface to define thereby a ramped, face surface which extends to a back-angled, force-receiving surface. A hook member is positioned beneath the second surface and is affixed thereto. The hook member is positioned to permit mated engagement with the tongue member and is capable of elastic deformation such that, when the first and second surfaces are positioned in tandem, extension the resilient tongue member through the hook member causes forces to be exerted by the ramped, face surface of the tongue member against the hook member to elastically deform the hook member thereby, and to position the back-angled, force-receiving surface of the tongue member above a top edge surface of the hook member whereby separation forces exerted upon the tandemly-positioned first and second surfaces cause the back-angled, forced-receiving surface of the tongue member to abut against the top edge surface of the hook member.

BRIEF DESCRIPTION OF THE DRAWINGS

The present invention will be better understood when read in light of the accompanying drawings in which.

DESCRIPTION OF THE PREFERRED EMBODIMENTS

Figure 1:
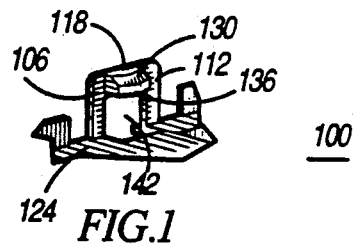
FIG. 1 is a cut away, isometric view of the tongue member forming a portion of the fastener of the preferred embodiment of the present invention.

Turning first to the isometric view of FIG. 1, a tongue member, referred to generally by reference numeral 100, which forms a portion of the fastener of the preferred embodiment of the present invention is shown. Tongue member 100 is U-shaped in configuration and includes first and second opposing leg members 106 and 112, respectively, interconnected by interconnecting leg 118. Leg members 106 and 112 are affixed, at end portions thereof, to surface 124, here a surface of a portion of a housing assembly.

In the preferred embodiment of the present invention, tongue member 100 is formed of a thermoplastic material, and is integrally formed with surface 124, also comprised of a thermoplastic material. (Other material, of construction may, of course, alternately be utilized.)

A top edge of interconnecting leg 118, here to top edge of an inner face surface of interconnecting leg 118, is beveled to define thereby ramped, face surface 130. Ramped, face surface 130 angles outwardly from the top edge of interconnecting leg 118, and extends to back-angled, force-receiving surface 136. In the preferred embodiment, surface 136 extends in a planar direction substantially parallel to a planar direction defined by surface 124.

Interconnecting leg 118 defines the separation distance separating first and second opposing legs 106 and 112 of tongue member 100. Such separation distance forms gap 142 between the opposing leg members 106 and 112. Preferably, and as illustrated, the width of ramped, face surface 130 corresponds to the width of gap 142 defined by the separation distance separating opposing legs 106 and 112.

When tongue member 100 is suitably affixed to surface 124 as shown, back-angled, force-receiving surface 136 is positioned at a fixed height above surface 124.

Figure 2:
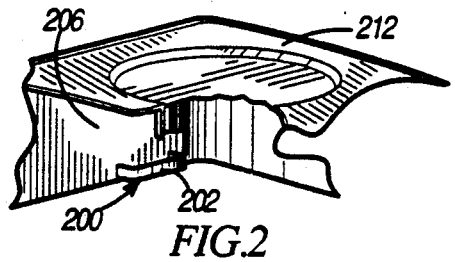
FIG. 2 is a cut away, isometric view of the hook member forming a portion of the fastener of the preferred embodiment of the present invention.

Turning next to the cut away, isometric view of FIG. 2, a hook member, referred to generally by reference numeral 200, which comprises a second portion of the fastener of the preferred embodiment of the present invention is shown. Hook member 200 is comprised of an elongated, U-shaped arm formed by elongated interconnecting leg 202, and is affixed at opposing end portions thereof to flange 206 formed to extend beneath surface 212. Here, flange 206 and surface 212 comprise a housing portion of a housing assembly. In the preferred embodiment, hook member 200 is comprised of a thermoplastic material, capable of elastic deformation responsive to application of forces thereupon. Hook member 200 may alternately be comprised of another elastically-deformable material. Flange 206 and surface 212 are also preferably comprised of a thermoplastic material permitting hook member 200 to be integrally formed therewith.

Interconnecting leg member 202 of hook member 200 is elongated in a lengthwise dimension relative to a depth dimension thereof. Such ratio of length to depth of the thermoplastic material of which hook member 200 is preferably comprised permits elastic deformation of interconnecting leg member 202 responsive to application of forces upon a face surface thereof. (In the preferred embodiment, tongue member 100 shown in FIG. 1 and hook member 200 are both comprised of the same type of thermoplastic material. Due to the elongation of interconnecting leg 202, hook member 200 is elastically deformable, while face surface 130 of tongue member 100 is not deform.)

For reasons to be explained more fully hereinbelow, the heightwise dimension of hook member 200 corresponds to, but is slightly less than, the elevation at which back-angled, force-receiving surface 136 of tongue member 100 of FIG. 1 is positioned above surface 124. Also, hook member 200 is of a thickness corresponding to, but slightly less than, the thickness of force-receiving surface 136, and the length of interconnecting leg member 202 corresponds to, and is slightly greater than, the width of the body of tongue member 100.

Figure 3:
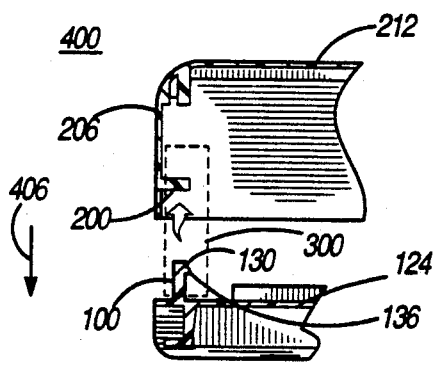
FIG. 3 is a cross-sectional view illustrating the relationship between the tongue member of FIG. 1 and the hook member of FIG. 2 of the preferred embodiment of the present invention as two surfaces, here portions of a housing assembly, are tandemly-positioned to be fastened theretogether.

Turning next to the sectional view of FIG. 3, the operational relationship between tongue member 100 and hook member 200 of FIGS. 1 and 2, respectively, which together comprise the fastener of the present invention are shown. The fastener formed therefrom is indicated in the Figure by block 300, shown in hatch. Surfaces 124 and 212 to which tongue member 100 and hook member 200 are affixed, respectively, are tandemly-positioned to position tongue member 100 and hook member 200 proximate to one another.

In the preferred embodiment illustrated in FIG. 3, surfaces 124 and 212, and flange 206 together form front, rear, and side walls of a housing assembly, here referred to generally by reference numeral 400. That is, surface 124 forms a portion of a rear housing portion of housing assembly 400; flange 206 and surface 212 form a portion of a front housing portion of housing assembly 400.

As noted previously, in the preferred embodiment, tongue member 100 is integrally formed with surface 124, and hook member 200 is integrally formed with flange 206 and surface 212. Accordingly, fastener 300 (comprised of tongue member 100 and fastener 200) also forms a portion of housing assembly 400.

As illustrated, when surfaces 124 and 212 are tandemly-positioned, and aligned as shown, flange 206 extends downwardly beneath a perimetal portion of surface 212, and extends toward a corresponding, perimetal portion of surface 124. When surfaces 124 and 212 are tandemly positioned and aligned, as shown, to position flange 206 above a perimetal portion of surface 124, tongue member 100 is positioned at an interior side of flange 206. That is to say, when surfaces 124 and 212 of housing assembly 400 are positioned as shown, tongue member 100 is positioned in the area to be enclosed by the housing assembly.

The opposing leg members of tongue member 100 (here, leg member 112 is illustrated) is positioned between flange 206 and hook member 200. However, ramped, face surface 130 of tongue member 100 extends within the area to be enclosed by housing assembly 400 a distance corresponding to the position of hook member 200.

The sectional view of FIG. 3 illustrates initial positioning of the surfaces 124 and 212 wherein the surfaces are tandemly-positioned, and aligned with one another, but prior to translation of surface 212 in the direction indicated by arrow 406 (or alternately, translation of surface 124 in a direction opposite with that of the direction of arrow 406). The initial position of surfaces 124 and 212 shown in FIG. 3 illustrates fastener 300 in an unfastened position.

Figure 4:
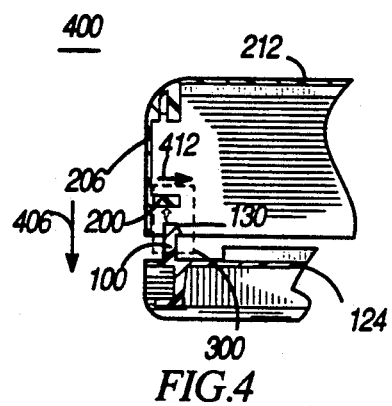
FIG. 4 is a cross-sectional view, similar with that of FIG. 3, but illustrating the relationship between the tongue and the hook member during translation of the tongue member into a fastening position to fasten the portions of the housing assembly theretogether.

Turning next to the cross-sectional view of FIG. 4, the relationship between tongue member 100 and hook member 200 during translation of surface 212 in the direction indicated by arrow 406 (or, again, alternately, during translation of surface 124 in a direction opposite with that of the direction of arrow 406) is shown. After further translation, beyond the relative positions of tongue and hook members 100 and 200 shown in FIG. 4, hook member 200 abuts against ramped, face surface 130 of tongue member 100. Such abutting engagement results in the exertion of forces by tongue member 100 through ramped, face surface 130 thereof upon hook member 200. Because hook member 200 is elastically-deformable, such forces exerted upon hook member 200 cause the elastic deformation of the hook member. The amount of elastic deformation of hook member 200 is indicated by line segment 412, and hook member 200 remains elastically-deformed for so long as components of the forces exerted by ramped, face surface 130 of tongue member 100 are exerted against the hook member.

FIG. 4 illustrates an intermediate position of fastener 300 during translation of surfaces 124 and 212 of housing assembly 400 to position an edge surface of flange 206 in abutting engagement upon a perimetal portion of surface 124.

Figure 5:
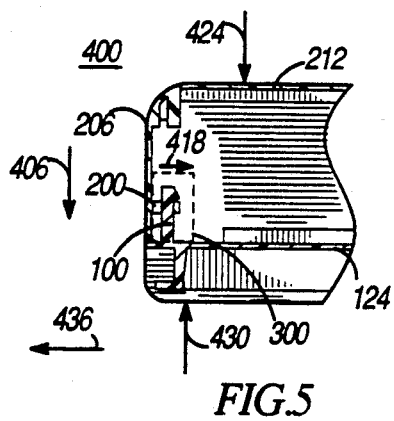
FIG. 5 is cross-sectional view, similar with those of FIGS. 3-4, but illustrating the relationship between the tongue member and the hook member when the tongue member is positioned at the fastening position whereat the portions of the housing assembly are fastened theretogether.

Turning next to the cross-sectional view of FIG. 5, the relationship between tongue member 100 and hook member 200 of fastener 300 is shown once surface 212 has been translated in the direction indicated by arrow 406 (or, once again, alternately, translation of surface 124 in a direction opposite with that of the direction of arrow 406) to position flange 206 in abutting engagement upon a perimetal portion of surface 124.

Once fully translated, fastener 300 is positioned in a fastening position. As shown, hook member 200 is positioned beneath back-angled force-receiving surface 136 of tongue member 100. Hook member 200 and tongue member 100 are no longer in abutting engagement with one another. Hence, the forces exerted by ramped, face surface 130 upon hook member 200 to cause the elastic deformation of the hook member (as shown in FIG. 4) are no longer exerted. Hence, the hook member returns to a nondeformed position as indicated by translation in the direction indicated by arrow 418. Translation of hook member 200 in the direction indicated by arrow 418 corresponds to, but is in a direction opposite to, the translation of hook member 200 in the direction indicated by arrow 412 of FIG. 4.

Once hook member 200 returns to a nondeformed position, tongue member 100 and hook member 200 are fastened theretogether as any forces exerted upon surface 124 in the direction indicated by arrow 406 causes back-angled force-receiving surface 136 of tongue member 100 to abut against a top, edge surface of hook member 200, thereby preventing translation of surface 124. Alternately, forces exerted upon surface 212 in a direction opposite with that of the direction of arrow 406 cause the top, edge surface of hook member 200 to abut against the back-angled, forced-receiving surface 136, to prevent thereby translation of surface 212. Movement of flange 206 responsive to force moments generated upon flange 206 due to application of forces in the direction of, or opposite to the direction of arrow 424 is prevented due to abutment between face surfaces of tongue member 100 and hook member 200, and to the correspondence of the dimensions of the tongue and hook members 100 and 200, respectively, as noted previously.

Formation of hook member 200 to be of heightwise dimensions substantially corresponding to, but slightly less than, the elevation at which back-angled, forced-receiving surface 136 is located above surface 124 is advantageous for the reason that forces exerted upon either surface 124 or surface 212 are transmitted to the other surface by way of fastener 300.

For instance, a compressive force exerted upon surface 212 in the direction indicated by arrow 424 is transmitted to surface 124 by way of a bottom edge surface of hook member 200. Analogously, a compressive force exerted upon surface 124 in a direction indicated by arrow 430 is transmitted to surface 212, again by way of a bottom edge of hook member 200. Such transmission of compressive forces of surfaces 124 and 212 of housing assembly 400 which would otherwise result in force moments tending to cause disengagement of the housing portions from each other, are instead prevented from doing so because of the abutting engagement of a face surface of hook member 200 with the tongue member.

Such force transmission to opposing ones of the surfaces is particularly advantageous when the surfaces 124 and 212 are of minimal dimensions, and, more particularly, thicknesses. That is to say, as noted hereinabove, as a result of ongoing, size reduction in the housings and other mechanical structures of electronic devices, the dimensions of such housings and other mechanical structure have been reduced to form housings which are as small as structurally possible. Fastener 300, when forming a portion of housing assembly 400, permits further reduction in the thicknesses of the surfaces, as the forces which a surface must be required to withstand is reduced as portions of forces exerted upon one surface are transmitted to an opposing surface.

Fastener 300 is further advantageous for the reason that torsional forces, that is, forces exerted in a direction indicated by arrow 436, act in a direction corresponding to a fastener force which fastens tongue member 100 and hook member 200 of fastener 300 theretogether. Such torsional forces occur, for instance, when housing assembly 400 is dropped upon a surface. Such forces, referred to as "dropping forces" act in a direction parallel to that of arrow 436. Such forces tend to pull hook member 200 against tongue member 100 to maintain fastener 300 in a fastened position. (Conversely, fasteners of existing housing assemblies tend to cause unfastening of conventional fasteners.)

Figure 6:
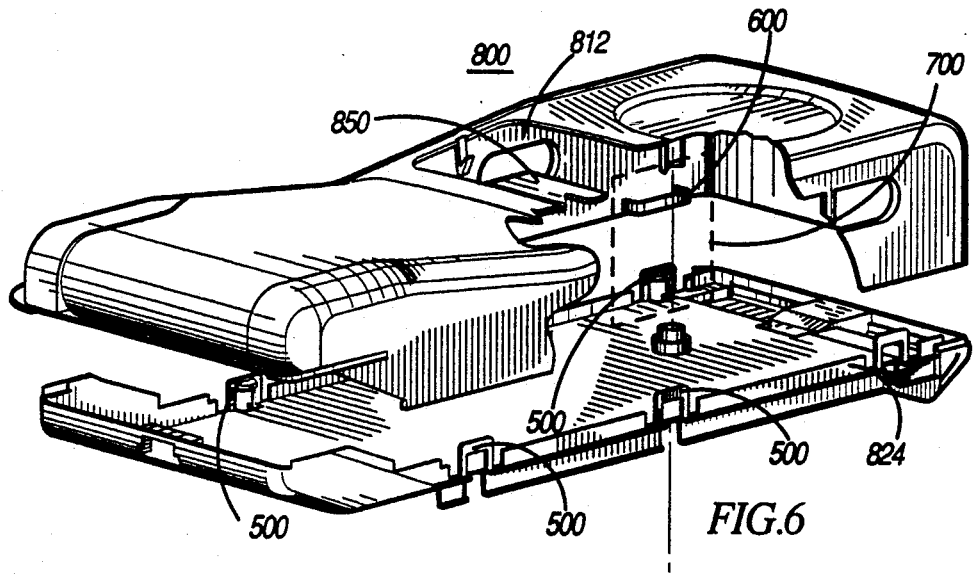
FIG. 6 is a cut away, isometric view of a housing assembly of a preferred embodiment of the present invention in which the fastener of the preceding figures forms a portion thereof.

Turning next to the isometric, cut away view of FIG. 6, a tongue member, here referred to generally by reference numeral 500, and a hook member, here referred to generally by reference numeral 600, together form a fastener which forms a portion of a radio transceiver housing assembly, referred to generally in the figure by reference numeral 800. Tongue member 500 corresponds to tongue member 100 of the preceding figures, and hook member 600 corresponds to hook member 200 of the preceding figures. Housing assembly 800 is further shown to include front housing portion 812 and rear housing portion 824. Tongue member 500 is formed to extend upwardly beyond a face surface of rear housing portion 824, and hook member 600 is shown to extend within a flange forming a sidewall of front housing 812.

Front and rear housing portions 812 and 824, respectively, are formed of a thermoplastic material, and tongue member 500 and hook member 600 are formed integral with the corresponding portions of housing assembly 800 also to be comprised of the thermoplastic material.

Fasteners formed of similar such tongue member-hook member pairs 500–600 are formed at spaced-apart locations about perimetal portions of front and rear housing portions 812 and 824 of housing assembly 800. Two fasteners formed of tongue member-hook member pairs 500–600 are illustrated in the cut away view of FIG. 6. A portion of electrical circuit board 850 is further shown in the cut away view of FIG. 6. Electronic circuitry disposed upon circuit board 850 is housed within housing assembly 800 to be supportively housed therewithin.

Figure 7:
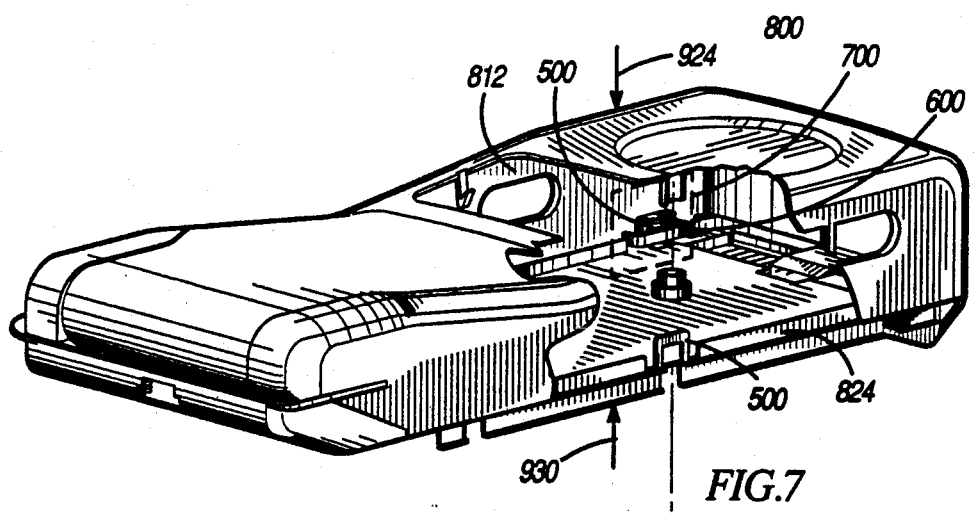
FIG. 7 is a cut away, isometric view, similar with that of FIG. 5, but wherein the fastener is positioned in a fastening position to fasten the housing portions of the housing assembly theretogether.

FIG. 7 is a cut away, isometric view, similar with that of FIG. 6, but illustrating the fasteners formed of tongue member-hook member pairs 500–600 when in the fastened position. As noted previously, because the height-wise dimension of hook members 600 corresponds to, but are slightly less than, the elevations at which back-angled, force-receiving surfaces (analogous to surface 136 of FIGS. 1–5) are above a surface of rear housing portion 824, compressive forces exerted upon front face surface 812 in the direction indicated by arrow 924 or in the direction indicated by arrow 930 upon rear housing portion 824 cause transmission of such forces to opposing ones of the surfaces 812 and 824 by way of a bottom edge surface of hook member 600. Also, because the thickness of hook member 600 corresponds to the thickness of the force-receiving surface formed upon the tongue member 500, and because the width of tongue member 500 corresponds to the length of the interconnecting leg of tongue member 600, torsional forces acting on the housing do not result in separation of the housing portions thereapart.

Separation forces exerted upon front and rear housing portions 812 and 824, respectively, in directions opposite to those indicated by arrows 924 and 930 cause a top edge surface of hook member 600 to abut against a back-angled, force-receiving surface of tongue member 500 to prevent separation of housing assembly portions 812 and 824 thereapart. Still further, torsional forces, such as "dropping forces," tend to pull a side face surface of hook member 600 against tongue member 500 thereby to maintain housing assembly portions 812 and 824 in a fastened position theretogether.

Figure 8:
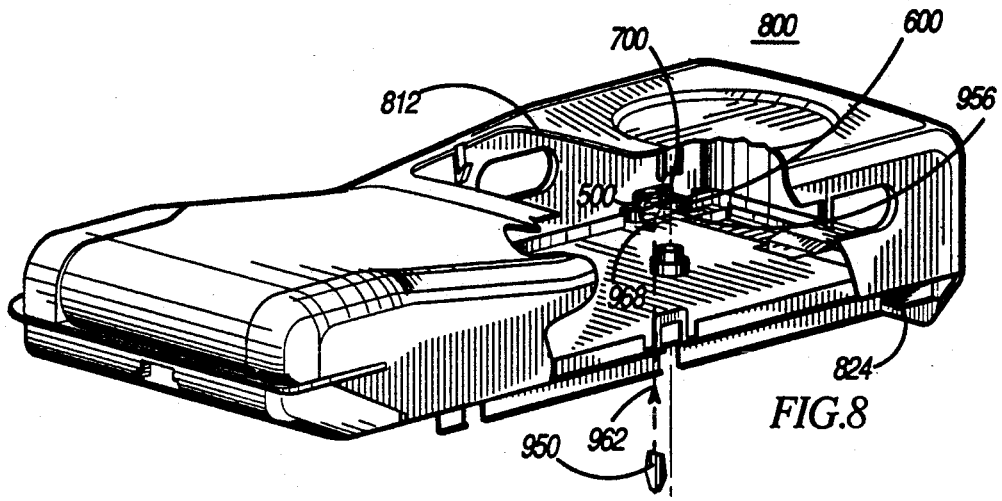
FIG. 8 is a cut away, isometric view, similar with that of FIG. 7, but illustrating a tool positioned to release the fastener from the fastening position thereby to permit unfastening of the portions of the housing assembly from one another.

Tuning next to the cut away, isometric view of FIG. 8, a view of a portion of housing assembly 800 is again shown wherein, similar to the illustration of FIG. 7, tongue member 500 and hook member 600 are fastened theretogether in a fastening position. Tool 950 is further illustrated in the figure, positioned beneath rear housing portion 824 of the housing assembly. Translation of tool 950 through aperture 956 formed to extend through a face surface of rear housing portion 824 permits translation of tool 950 in a direction indicated by arrow 962 to wedge tool 950 in position between tongue member 500 and hook member 600. Once wedged therebetween, rotation of tool 950 in a direction indicated by arrow 968, causes elastic deformation of hook member 600 to permit translation of tongue member 500 out of the fastening position. A similar such operation with tool 950 upon other fasteners formed of other tongue member-hook member pairs 500–600 at spaced-apart locations about the peripheral portions of housing assembly 800 permits separation of housing portions 812 and 824 from one another.

Figure 9:
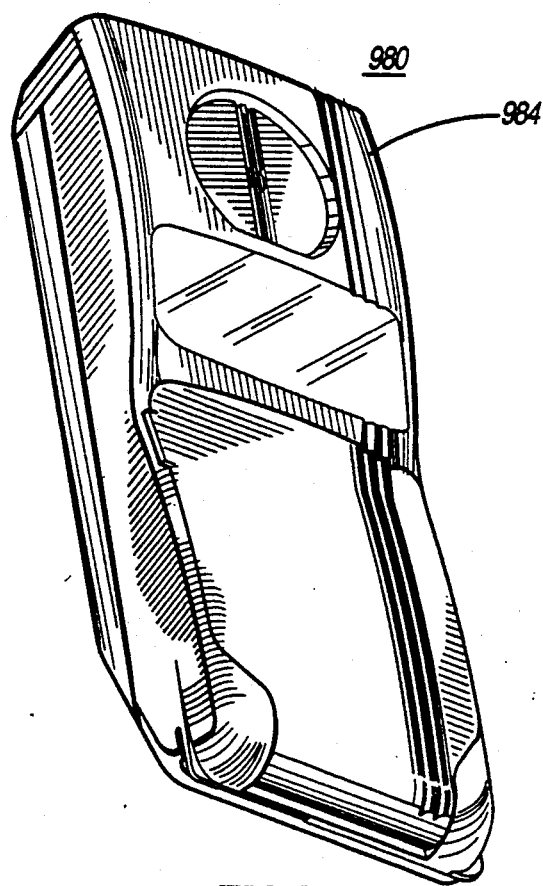
FIG. 9 is an isometric view of a radio transceiver of a preferred embodiment of the present invention which incorporates the fastener of the preceding figures as a portion thereof.

Finally turning to the isometric view of FIG. 9, a radio transceiver, referred to generally by reference numeral 980, of a preferred embodiment of the present invention is shown. Radio transceiver 980, here illustrated is a portable radiotelephone operable in a cellular, communication system.

Radio transceiver 980 includes housing 984 which is formed of front and rear housing portions, and which corresponds to housing 800 of FIGS. 6–8. Fasteners formed of tongue member-hook member pairs, similar to tongue member-hook member pairs 500–600 of FIGS. 6–8 are formed integral with housing assembly 984 to fasten the housing portions of housing 984 of radio transceiver 980 theretogether.

The fasteners formed of such tongue member-hook member pairs fasten the front and rear housing portions of housing assembly 984 theretogether even during conditions in which compressive, separation, and/or torsional forces are exerted upon the housing assembly. Also, because the seating surface whereat the front and rear housing portions of housing assembly 984 meet is formed close to a rear face surface of the rear housing portion, emanation of spurious electromagnetic signals through the parting line formed at the seating surface is minimized. That is to say, because the parting is located beneath the circuit board, electromagnetic signals generated during circuit operation tend to be directed toward the sidewalls rather than through any opening formed by the parting line. Still further, because the fastener formed of the tongue member-hook member pairs releasably fasten the front and rear housing portions theretogether, the front and rear housing portions may be released from their fastening engagement is so required.

While the present invention has been described in connection with the preferred embodiment shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A fastener assembly comprising:
a first surface;
a second surface positionable in tandem with the first surface;
a resilient tongue member having at least one upstanding leg member affixed at a first end thereof to the first surface and positioned to extend upwardly therefrom, the at least one upstanding leg member of said tongue member having a beveled, top edge surface formed at a second end thereof to define thereby a ramped, face surface which extends to a back-angled, force-receiving surface, and a side face surface extending along a side face of the tongue member; and
a hook member formed of an elongated, U-shaped arm positioned beneath the second surface and affixed at opposing ends thereof to be maintained in a fixed orientation relative to the second surface, the U-shaped arm of a height of a magnitude corresponding to, but slightly less than a magnitude of a length separating the first and second ends of the at least one upstanding leg member of the resilient tongue member, said hook member defining top and bottom edge surfaces and a side face surface thereof, the hook member being capable of elastic deformation and operable to matingly engage with the tongue member such that, when the first and second surfaces, respectively, are positioned in tandem, extension of the resilient tongue member through the hook member causes forces to be exerted by the ramped, face surface of the tongue member against the hook member to elastically deform the hook member thereby, thereafter to position the U-shaped arm forming the hook member between the first and second ends of the at least one upstanding leg member of the resilient tongue member, to position thereby the back-angled, force-receiving surface of the tongue member above a top edge surface of the hook member whereby separation forces exerted upon the tandemly-positioned first and second surfaces cause the back-angled, force-receiving surface of the tongue member to abut against the top edge surface of the hook member, whereby compressive forces exerted upon the second surface are transmitted to the first surface by way of a bottom edge surface of the hook member, and whereby torsional forces exerted upon the first and second surfaces, respectively, are transmitted therebetween by way of side face surfaces of the tongue and hook members, respectively.

2. A fastener assembly comprising:
a housing assembly comprised of a front housing portion and a tandemly-positioned, rear housing portion;
a resilient tongue member having at least one upstanding leg member affixed at a first end thereof to a surface of the rear housing portion and positioned to extend upwardly therefrom, the at least one upstanding leg member of said tongue member having a beveled, top edge surface formed at a second end thereof to define thereby a ramped, face surface which extends to a back-angled, force-receiving surface; and
a hook member formed of an elongated U-shaped arm positioned beneath a surface of the front housing portion and affixed at opposing ends thereof to be maintained in a fixed orientation relative to the surface of the front housing portion, the U-shaped arm of a height of a magnitude corresponding to, but slightly less than a magnitude of a length separating the first and second ends of the at least one upstanding leg member of the resilient tongue member, said hook member capable of elastic deformation and operable to matingly engage with the tongue member such that, when the front and rear housing portions, respectively, are positioned in tandem, extension of the resilient tongue member through the hook member causes forces to be exerted by the ramped, face surface of the tongue member against the hook member to elastically deform the hook member thereby, thereafter to position the U-shaped arm forming the hook member between the first and second ends of the at least one upstanding leg member of the resilient tongue member, to position thereby the back-angled, force-receiving surface of the tongue member above a top edge surface of the hook member whereby separation forces exerted upon the housing assembly cause the back-angled, force-receiving surface of the tongue member to abut against the top edge surface of the hook member, whereby compressive forces exerted upon the front housing portion are transmitted to the rear housing portion by way of a bottom edge surface of the hook member, and whereby torsional forces exerted upon the housing assembly are transmitted between the front and rear housing portions, respectively, by way of side face surfaces of the tongue and hook members, respectively.

3. The fastener assembly of claim 1 wherein said resilient tongue member is integrally formed with the rear housing portion of the housing assembly.

4. The fastener assembly of claim 1 wherein said hook member is integrally formed with the front housing portion of the housing assembly.

5. The fastener assembly of claim 2 wherein said resilient tongue member comprises first and second opposing, upstanding leg members, each affixed at first ends thereof to the surface of the rear housing portion of the housing assembly and an interconnecting leg member which interconnects the first and second opposing, upstanding leg members wherein a separation distance separating the first and second opposing, upstanding leg members defines a gap between the first and second opposing leg members.

6. The fastener assembly of claim 5 wherein the ramped, face surface of the resilient tongue member is formed on a side surface of the interconnecting leg member.

7. The fastener assembly of claim 6 wherein the ramped, face surface formed on the side surface of the interconnecting leg member is formed at a location along the side surface above the gap defined by the separation distance separating the first and second opposing, upstanding leg members.

8. The fastener assembly of claim 7 wherein the ramped, face surface formed on the side surface of the interconnecting leg member is of a width corresponding to a width-wise dimension of the gap defined by the separation distance separating the first and second opposing, upstanding leg members.

9. The fastener assembly of claim 2 wherein the resilient tongue member is affixed to the surface of the rear housing portion at a perimetal portion thereof.

10. The fastener assembly of claim 9 wherein the elongated, U-shaped arm comprising the hook member is formed on an inner surface of a flange extending beneath perimetal portions of the surface of the front housing portion.

11. The fastener assembly of claim 10 wherein the elongated, U-shaped arm comprising the hook member is affixed at opposing ends thereof to the inner surface of the flange whereby the U-shaped arm together with the inner surface of the flange defines a receiving area for extension of the tongue member therethrough.

12. The fastener assembly of claim 1 wherein the resilient tongue member is comprised of a thermoplastic material.

13. The fastener assembly of claim 1 wherein the hook member is comprised of a thermoplastic material.

14. In a radio transceiver having electronic circuitry disposed upon at least one circuit board and housed within a housing assembly comprised of a front housing portion and a tandemly-positioned, rear housing portion theretogether, the combination with the housing assembly of a fastener for fastening the front and rear housing portions, respectively, theretogether, said fastener comprising:

a resilient tongue member having at least one upstanding leg member affixed at a first end thereof to a surface of the rear housing portion and positioned to extend upwardly therefrom, the at least one upstanding leg member of said tongue member having a beveled, top edge surface formed at a second end thereof to define thereby a ramped, face surface which extends to a back-angled, force-receiving surface, and a side face surface extending along a side face of the tongue member; and a hook member formed of an elongated U-shaped arm positioned beneath a surface of the front housing portion and affixed at opposing ends thereof to be maintained in a fixed orientation relative to the surface of the front housing portion, the U-shaped arm of a height of a magnitude corresponding to, but slightly less than a magnitude of a length separating the first and second ends of the at least one upstanding leg member of the resilient tongue member, said hook member defining top and bottom edge surfaces and a side face surface thereof, the hook member being capable of elastic deformation and operable to matingly engage with the tongue member such that, when the front and rear housing portions, respectively, are positioned in tandem, extension of the resilient tongue member through the hook member causes forces to be exerted by the ramped, face surface of the tongue member against the hook member to elastically deform the hook member thereby, thereafter to position the U-shaped arm forming the hook member between the first and second ends of the at least one upstanding leg member of the resilient tongue member, to position thereby the back-angled, force-receiving surface of the tongue member above a top edge surface of the hook member whereby separation forces exerted upon the housing assembly cause the back-angled, force-receiving surface of the tongue member to abut against the top edge surface of the hook member, whereby compressive forces exerted upon the front housing portion are transmitted to the rear housing portion by way of a bottom edge surface of the hook member, and whereby torsional forces exerted upon the housing assembly are transmitted between the front and rear housing portions, respectively, by side face surfaces of the tongue and hook members, respectively.

15. A housing assembly for housing an electronic circuit disposed upon at least one circuit board, said housing assembly comprising:

a front housing portion having a face surface and a flange extending about perimetal portions thereof;

a rear housing portion having a face surface of dimensions suitable for receiving the flange extending about the perimetal portions of the face surface of the front housing portion when positioned in tandem therewith;

a resilient tongue member having at least one upstanding leg member affixed at a first end thereof to a surface of the rear housing portion and positioned to extend upwardly therefrom, the at least one upstanding leg member of said tongue member having a beveled, top edge surface formed at a second end thereof to define thereby a ramped, face surface which extends to a back-angled, force-receiving surface and a side face surface extending along a side face of the tongue member; and a hook member formed of an elongated U-shaped arm affixed at opposing ends thereof to the flange of the front housing portion, the U-shaped arm of a height of a magnitude corresponding to, but slightly less than a magnitude of a length separating the first and second ends of the at least one upstanding leg member of the resilient tongue member, said hook member defining top and bottom edge surfacers and a side face surface thereof, the hook member being capable of elastic deformation and operable to matingly engage with the tongue member such that, when the front and rear housing portions, respectively, are positioned in tandem, extension of the resilient tongue member through the hook member causes forces to be exerted by the ramped, face surface of the tongue member against the hook member to elastically deform the hook member thereby, thereafter to position the U-shaped arm forming the hook member between the first and second ends of the at least one upstanding leg member of the resilient tongue member, to position thereby the back-angled, force-receiving surface of the tongue member above a top edge surface of the hook member whereby separation forces exerted upon the housing assembly cause the back-angled, force-receiving surface of the tongue member to abut against the top edge surface of the hook member, whereby compressive forces exerted upon the front housing portion are transmitted to the rear housing portion by way of a bottom edge surface of the hook member, and whereby torsional forces exerted upon the front and rear housing portions, respectively, are transmitted therebetween by way of side face surfaces of the tongue and hook members, respectively.

* * * * *